(12) United States Patent
Maiti et al.

(10) Patent No.: US 9,064,559 B2
(45) Date of Patent: Jun. 23, 2015

(54) MEMORY DEVICE AND METHOD OF PERFORMING ACCESS OPERATIONS WITHIN SUCH A MEMORY DEVICE

(71) Applicant: ARM LIMITED, Cambridge (GB)

(72) Inventors: Bikas Maiti, Austin, TX (US); Yew Keong Chong, New Braunfels, TX (US); Martin Jay Kinkade, Austin, TX (US)

(73) Assignee: ARM Limited, Cambridge (GB)

( * ) Notice: Subject to any disclaimer, the term of this patent is extended or adjusted under 35 U.S.C. 154(b) by 125 days.

(21) Appl. No.: 13/967,879

(22) Filed: Aug. 15, 2013

(65) Prior Publication Data

US 2015/0049563 A1    Feb. 19, 2015

(51) Int. Cl.
*G11C 7/22* (2006.01)

(52) U.S. Cl.
CPC .................................. *G11C 7/22* (2013.01)

(58) Field of Classification Search
CPC ....... G11C 7/22; G11C 7/222; G11C 11/4076
USPC .................................................. 365/194, 226
See application file for complete search history.

(56) References Cited

U.S. PATENT DOCUMENTS

| 7,289,373 B1 * | 10/2007 | Son et al. ................. 365/189.02 |
| 8,599,626 B2 * | 12/2013 | Hold ......................... 365/189.15 |
| 2008/0037338 A1 | 2/2008 | Chen et al. |
| 2008/0106311 A1 | 5/2008 | Do |
| 2008/0123453 A1 | 5/2008 | Seo |
| 2010/0085824 A1 | 4/2010 | Nagata |
| 2010/0165754 A1 | 7/2010 | Gupta et al. |
| 2010/0284232 A1 | 11/2010 | Wang |
| 2011/0216618 A1 | 9/2011 | Prasad et al. |

FOREIGN PATENT DOCUMENTS

WO    2010/019868    2/2010

OTHER PUBLICATIONS

GB Search Report dated Jan. 9, 2015 in GB 1412312.9, 4 pages.

* cited by examiner

*Primary Examiner* — Son Dinh
(74) *Attorney, Agent, or Firm* — Pramudji Law Group PLLC; Ari Pramudji

(57) ABSTRACT

A memory device includes an array of memory cells arranged as a plurality of rows and columns, a plurality of word lines, each word line being coupled to an associated row of memory cells, and a plurality of bit lines, each bit line being coupled to an associated column of memory cells. Access circuitry is coupled to the word lines and the bit lines in order to perform access operations in respect of selected memory cells within the array. Control circuitry controls operation of the access circuitry and includes self-timed path (STP) delay circuitry. The control circuitry employs the delay indication when controlling the access circuitry to perform said access operations. Voltage supply control circuitry switches the voltage supply to at least one portion of the STP delay circuitry between a peripheral voltage supply and an array voltage supply dependent on a control signal.

13 Claims, 10 Drawing Sheets

| read_SigCmax_ssa_0p84v_0p76v_m40c/1496x40m8_bgmrt | vddpe | vddce | dwl_header | Senseamp Differential for READ (mV) |
|---|---|---|---|---|
| test case 1 - with vddpe | 0.84 | 0.84 | vddpe | 140 |
| test case 2 - with vddpe | 0.84 | 0.76 | vddpe | 79 |
| test case 3 - with vddpe | 0.84 | 0.72 | vddpe | 53 |
| test case 4 - with vddpe | 0.84 | 0.7 | vddpe | 42 |
| test case 1 - with vddce | 0.84 | 0.84 | vddce | 133 |
| test case 2 - with vddce | 0.84 | 0.76 | vddce | 100 |
| test case 3 - with vddce | 0.84 | 0.72 | vddce | 84 |
| test case 4 - with vddce | 0.84 | 0.7 | vddce | 74 |

FIG. 8

| write_SigCmax_sfa_0p7v_0p7v_m40c/1496x40m8_bgmrt | vddpe | vddce | dwl_header | Write margin for WRITE (ratio) |
|---|---|---|---|---|
| test case 1 - with vddpe | 0.84 | 0.84 | vddpe | 1.86 |
| test case 2 - with vddpe | 0.84 | 0.76 | vddpe | 1.43 |
| test case 3 - with vddpe | 0.84 | 0.72 | vddpe | 1.15 |
| test case 4 - with vddpe | 0.84 | 0.7 | vddpe | failed |
| test case 1 - with vddce | 0.84 | 0.84 | vddce | 1.85 |
| test case 2 - with vddce | 0.84 | 0.76 | vddce | 1.51 |
| test case 3 - with vddce | 0.84 | 0.72 | vddce | 1.25 |
| test case 4 - with vddce | 0.84 | 0.7 | vddce | 1.09 |

FIG. 9

MEMORY DEVICE AND METHOD OF PERFORMING ACCESS OPERATIONS WITHIN SUCH A MEMORY DEVICE

BACKGROUND OF THE INVENTION

1. Field of the Invention

The present invention relates to a memory device comprising an array of memory cells, and to a method of performing access operations within such a memory device.

2. Description of the Prior Art

A typical memory device has an array of memory cells arranged as a plurality of rows and columns, word lines being coupled to the rows and bit lines being coupled to the columns. Access circuitry then performs read and write access operations in respect of selected memory cells using the word lines and bit lines. Control circuitry is used to control operation of the access circuitry when performing such access operations.

Since the memory cells (also referred to herein as memory bit cells) behave differently to the logic gates used to construct the access circuitry and control circuitry, it is known to employ a self-timed path (STP) delay circuit to seek to provide an indication of an access timing delay associated with accessing the memory cells, with the access circuitry then being controlled having regard to that indication produced by the STP delay circuitry.

Modern memory devices as used in System-on-Chips (SoCs) are often designed to use dual voltage domains, with the memory array being operated in an array voltage domain (also referred to as a core voltage domain) whilst much of the associated access circuitry and the control circuitry then operates in a peripheral voltage domain. The use of such a dual voltage domain enables the memory array to retain data by continuing to be powered while the peripheral circuits are shut down, thus assisting in reducing power consumption when the memory device is not being used. The STP delay circuitry would typically be operated in the peripheral voltage domain, in order to maximise the power consumption benefits achievable when the memory device is not being used.

Traditionally, the peripheral voltage supply used in the peripheral voltage domain has been arranged to be less than the core voltage supply used in the core voltage domain. Typically, memory designs have been able to cope with situations where the peripheral voltage supply is less than or equal to the core voltage supply by delaying a delay path within the STP delay circuitry using extra margin adjustment (EMA) pins. However, due to Power Management IC (PMIC) variation on the chip in modern memory designs, it is no longer possible to guarantee that the core voltage supply will be higher than the peripheral voltage supply.

In such situations, it has been found that the STP delay circuitry operating in the peripheral voltage domain may produce a delay indication which is insufficient to account for worst case access timing delay within the array of memory cells, thus giving rise to potential errors in the read and write operations performed in respect of the memory device. It would hence be desirable to provide a more reliable STP delay mechanism that can accommodate situations where the peripheral voltage supply is higher than the core voltage supply.

SUMMARY OF THE INVENTION

Viewed from a first aspect, the present invention provides a memory device comprising: an array of memory cells arranged as a plurality of rows and columns, the array operating in an array voltage domain with an array voltage supply; a plurality of word lines, each word line being coupled to an associated row of memory cells; a plurality of bit lines, each bit line being coupled to an associated column of memory cells; access circuitry coupled to the plurality of word lines and the plurality of bit lines in order to perform access operations in respect of selected memory cells within the array, at least a part of the access circuitry operating in a peripheral voltage domain with a peripheral voltage supply; control circuitry configure to control operation of the access circuitry, the control circuitry including self-timed path (STP) delay circuitry configured to generate a delay indication indicative of an access timing delay associated with accessing the memory cells, the control circuitry employing said delay indication when controlling the access circuitry to perform said access operations; and voltage supply control circuitry associated with at least one portion of the STP delay circuitry and configured to switch the voltage supply to said at least one portion of the STP delay circuitry between said peripheral voltage supply and said array voltage supply dependent on a control signal set having regard to the voltage levels of said array voltage supply and said peripheral voltage supply.

In accordance with the present invention, the voltage supply provided to at least one portion of the STP delay circuitry is configurable based on a control signal, with that control signal being set having regard to the voltage levels of the array voltage supply and the peripheral voltage supply. This provides an improved STP delay circuit mechanism which provides sufficient read and write margins not only when the peripheral voltage supply is less than the array voltage supply, but also in situations where the two voltage supplies are similar, and in situations where the peripheral voltage supply exceeds the array voltage supply.

The thresholds for switching the at least one portion of the STP delay circuitry between the peripheral voltage supply and the array voltage supply can be varied dependent on embodiment. However, in one embodiment, if the peripheral voltage supply is less than the array voltage supply by a predetermined amount, the voltage supply control circuitry is configured to provide the peripheral voltage supply to the at least one portion of the STP delay circuitry. The predetermined amount can be set dependent on embodiment, and can be arranged to take into account expected on chip fluctuations in the voltage levels.

In one embodiment, if the peripheral voltage supply is greater than the array voltage supply by a predetermined amount, the voltage supply control circuitry is configured to provide the array voltage supply to said at least one portion of the STP delay circuitry. Again, the predetermined amount can be set dependent on embodiment, and may be a different amount to that specified for situations where the peripheral voltage supply is less than the array voltage supply.

In one particular embodiment, the voltage supply control circuitry is associated with a plurality of portions of the STP delay circuitry, and is configured to provide the array voltage supply to one or more of said plurality of portions of the STP delay circuitry dependent on a degree to which the peripheral voltage supply is greater than the array voltage supply, and to provide the peripheral voltage supply to any remaining of said plurality of portions of the STP delay circuitry. Hence, the extent to which the portions of the STP delay circuitry have their voltage supply switched from the peripheral voltage supply to the array voltage supply can be staged to take into account the extent of the difference between the peripheral voltage supply and the array voltage supply in situations where the peripheral voltage supply is greater than the array voltage supply. Hence, when the difference is relatively small, less portions of the STP delay circuitry may have their voltage supply switched to the array voltage supply than would be the case when the difference is relatively large.

In one embodiment where the voltage supply control circuitry is associated with a plurality of portions of the STP delay circuitry, if the peripheral voltage supply is the same as the array voltage supply within a predetermined margin, the voltage supply control circuitry is configured to provide the array voltage supply to a subset of said plurality of portions of the STP delay circuitry, and to provide the peripheral voltage supply to the remaining of said plurality of portions of the STP delay circuitry. Hence, in this embodiment the system can begin to switch over the voltage supply for the STP delay circuit portions to the array voltage supply at a point where the two voltage supplies are approximately equal.

The control signal provided to the voltage supply control circuitry can be generated in a variety of ways. For example, in one embodiment, the control signal is user specified. In one embodiment, the user specifying the control signal will be the designer of a System on Chip (SoC) that is to incorporate the memory device, with the designer specifying a value of the control signal having regards to the expected voltage levels of the array voltage supply and the peripheral voltage supply.

In one embodiment, the memory device has a plurality of operating modes, and the voltage levels of the array voltage supply and the peripheral voltage supply are dependent on a current operating mode of the memory device. In such an embodiment, the value of the control signal provided to the voltage supply control circuitry can be configured to be dependent on the current operating mode. Hence, separate values of the control signal can be specified for each operating mode, and when the memory device switches to a new operating mode, the appropriate value of the control signal can then be output to the voltage supply control circuitry.

In one embodiment, the memory device (or the system in which the memory device is incorporated) further comprises voltage comparison circuitry configured to receive both the array voltage supply and the peripheral voltage supply, and to set the control signal dependent on an evaluation of the voltage levels of the array voltage supply and the peripheral voltage supply. Hence, in such an embodiment, the evaluation of the difference in the voltage levels between the array voltage supply and the peripheral voltage supply can be performed dynamically during operation, and the control signal set appropriately.

The STP delay circuitry can be arranged in a variety of ways. However, in one embodiment, the STP delay circuitry comprises a dummy word line coupled to a column dummy load representative of a loading of a word line within said plurality of word lines, and said at least one portion of the STP delay circuitry includes dummy word line driver circuitry used to control a voltage level on the dummy word line. Hence, in such embodiments, the voltage supply provided to the dummy word line driver circuitry can be varied dependent on the relative voltage levels of the array voltage supply and the peripheral voltage supply.

In one embodiment, the STP delay circuitry further comprises a dummy bit line coupled to a row dummy load representative of a loading of a bit line within said plurality of bit lines, and timing control circuitry coupled between said dummy word line and said dummy bit line, the timing control circuitry being configured to control how quickly a transition in voltage level on the dummy word line introduced by the dummy word line driver results in a transition in voltage on the dummy bit line. In such an embodiment, the timing control circuitry can be arranged to form one of said at least one portions of the STP delay circuitry whose voltage supply is controlled by the voltage supply control circuitry.

Viewed from a second aspect, the present invention provides a method of performing access operations within a memory device comprising an array of memory cells arranged as a plurality of rows and columns, the array operating in an array voltage domain with an array voltage supply, a plurality of word lines, each word line being coupled to an associated row of memory cells, a plurality of bit lines, each bit line being coupled to an associated column of memory cells, and access circuitry coupled to the plurality of word lines and the plurality of bit lines in order to perform access operations in respect of selected memory cells within the array, at least a part of the access circuitry operating in a peripheral voltage domain with a peripheral voltage supply, the method comprising: employing self-timed path (STP) delay circuitry to generate a delay indication indicative of an access timing delay associated with accessing the memory cells; referencing the delay indication when controlling the access circuitry to perform said access operations; and switching the voltage supply to at least one portion of the STP delay circuitry between said peripheral voltage supply and said array voltage supply dependent on a control signal set having regard to the voltage levels of said array voltage supply and said peripheral voltage supply.

Viewed from a third aspect, the present invention provides a computer program storage medium (for example a non-transitory storage medium) storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device in accordance with the first aspect of the present invention.

Viewed from a fourth aspect, the present invention provides a memory device comprising: an array of memory cell means arranged as a plurality of rows and columns, the array of memory cell means for operating in an array voltage domain with an array voltage supply; a plurality of word line means, each word line means for coupling to an associated row of memory cell means; a plurality of bit line means, each bit line means for coupling to an associated column of memory cell means; access means for coupling to the plurality of word line means and the plurality of bit line means in order to perform access operations in respect of selected memory cell means within the array, at least a part of the access means for operating in a peripheral voltage domain with a peripheral voltage supply; control means for controlling operation of the access means, the control means including self-timed path (STP) delay means for generating a delay indication indicative of an access timing delay associated with accessing the memory cell means, the control means for employing said delay indication when controlling the access means to perform said access operations; and voltage supply control means associated with at least one portion of the STP delay means and for switching the voltage supply to said at least one portion of the STP delay means between said peripheral voltage supply and said array voltage supply dependent on a control signal set having regard to the voltage levels of said array voltage supply and said peripheral voltage supply.

BRIEF DESCRIPTION OF THE DRAWINGS

The present invention will be described further, by way of example only, with reference to embodiments thereof as illustrated in the accompanying drawings, in which:

FIGS. 8 and 9 are tables schematically illustrating the improvements that can be achieved using the mechanism of the described embodiments;

DESCRIPTION OF EMBODIMENTS

Figure 1:
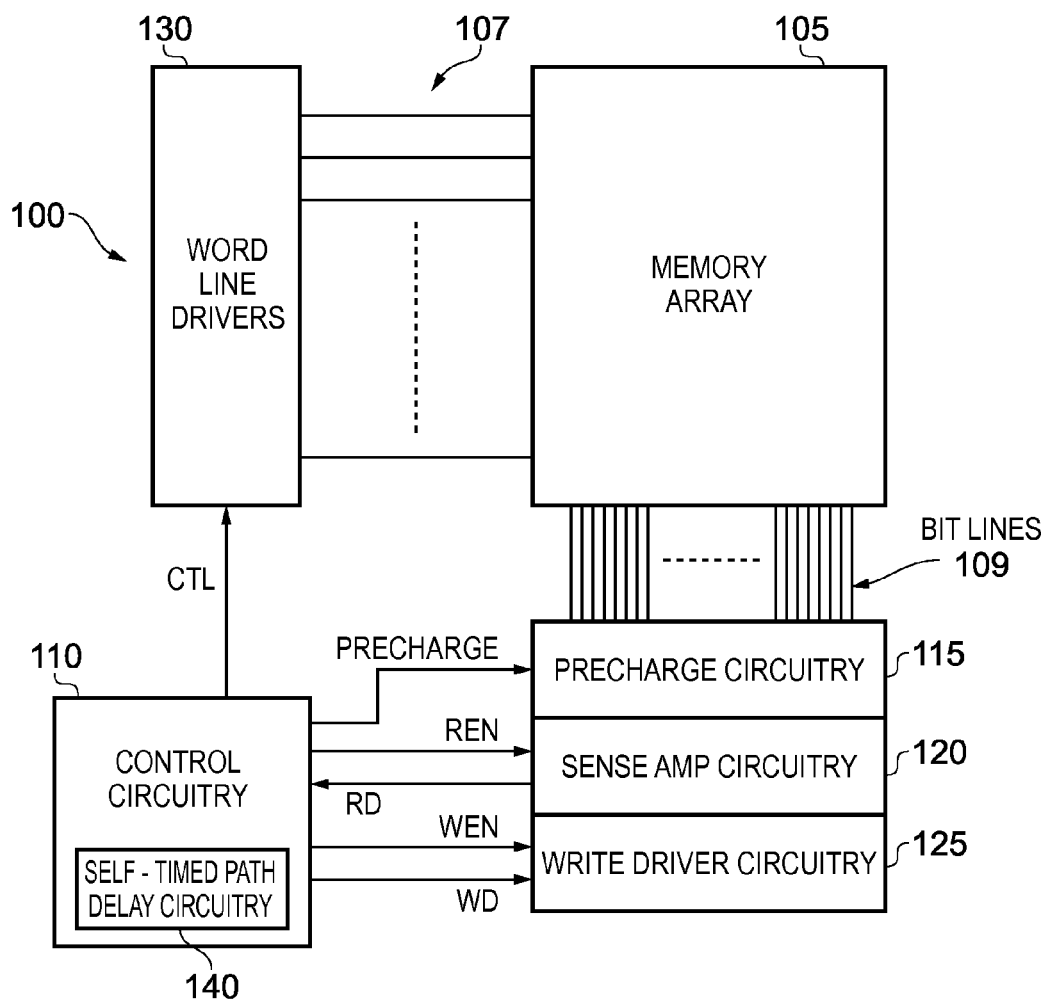
FIG. 1 is a block diagram schematically illustrating the logical arrangement of a memory device in accordance with one embodiment.

FIG. 1 is a diagram schematically illustrating a logical arrangement of a memory device in accordance with one embodiment. Whilst FIG. 1 is intended to logically illustrate the arrangement of the memory device, it will be appreciated that it is not intended to provide an indication of the structural arrangement.

The memory device 100 includes a memory array 105 comprising an array of memory cells arranged in a plurality of rows and columns. A plurality of word lines 107 are provided through the array in order to allow individual rows of memory cells to be addressed by the word line drivers 130 during access operations, which may be either write or read operations. In addition, a plurality of bit lines 109 are provided in association with the columns of memory cells. Each column is coupled to the relevant bit lines to enable data to be written into an activated memory cell of the column during a write operation, and for data to be read from an activated memory cell of the column during a read operation.

Precharge circuitry 115 is used to precharge the voltage level on the bit lines under the control of control circuitry 110. Following the precharge operation, a write operation or read operation can be performed. For a write operation, the control circuitry 110 will issue a control signal to the word line drivers 130 in order to cause a particular row of memory cells to be activated via the associated word line, and the control circuitry 110 will further cause the write driver circuitry 125 to control the voltages on the relevant bit lines, in order to cause the required data values to be written into the memory cells of the activated row. The write driver circuitry 125 is activated by a write enable (WEN) signal from the control circuitry, and then uses the write data (WD) provided by the control circuitry to control the voltages on the relevant bit lines.

For a read operation, again the control circuitry 110 will issue a control signal to the word line drivers 130 in order to cause a particular row of memory cells to be activated via the appropriate word line, and the sense amplifier circuitry 120 will then be used in order to evaluate the voltages on the relevant bit lines, with the sensed read data then being returned to the control circuitry 110. The sense amplifier circuitry 120 is activated by a read enable (REN) signal from the control circuitry, whereupon it evaluates the voltages on the relevant bit lines.

The memory bit cells forming the memory array 105 have a different behaviour to the logic gates used to form the other components 100, 110, 115, 120, 125 of the memory device. When performing read or write access operations, the various memory bit cells will provide a loading on the word lines and bit lines which will affect the time taken to access the activated memory cells. To seek to account for this access timing delay, the control circuitry 110 employs self-timed path (STP) delay circuitry 140 to generate a delay indication indicative of the access timing delay, with that delay indication then being used by the control circuitry 110 in order to determine when to assert the read enable (REN) signal for a read operation in order to trigger the sense amplifier circuitry 120 to evaluate the voltages on the bit lines, or to determine how long to assert the write enable (WEN) signal for during a write operation, so as to ensure that the write driver circuitry 125 maintains the appropriate voltages on the bit lines for long enough to ensure that the data is written into the addressed memory cells.

Modern memory devices used in System-on-Chips (SoCs) are often designed to use dual voltage domains, with the memory array 105 being operated in an array voltage domain (also referred to as a core voltage domain) with an array voltage supply (also referred to as a core voltage supply). Much of the associated access circuitry (formed by the word line drivers 130, precharge circuitry 115, sense amp circuitry 120 and write driver circuitry 125) and the control circuitry then operate in a peripheral voltage domain with a peripheral voltage supply. The use of such a dual voltage domain enables the memory array to retain data by continuing to be powered while the peripheral circuits are shut down, thus assisting in reducing power consumption when the memory device is not being used.

The STP delay circuitry 140 would typically be operated in the peripheral voltage domain, in order to maximise the power consumption benefits achievable when the memory device is not being used. However, whilst such an approach works well when it can be guaranteed that the peripheral voltage supply is less than the array voltage supply, it can give rise to incorrect operation when the peripheral voltage supply is approximately the same as the array voltage supply, or even exceeds the array voltage supply, since in those instances the STP delay circuitry may produce a delay indication which is insufficient to account for worst case access timing delay within the array of memory cells.

As will be discussed in more detail herein, this problem is addressed in the described embodiments by arranging for the voltage supply to one or more portions of the STP delay circuitry to be selectively switched between the peripheral voltage supply and the array voltage supply dependent on the relative voltage levels of the peripheral voltage supply and the array voltage supply.

Figure 2:
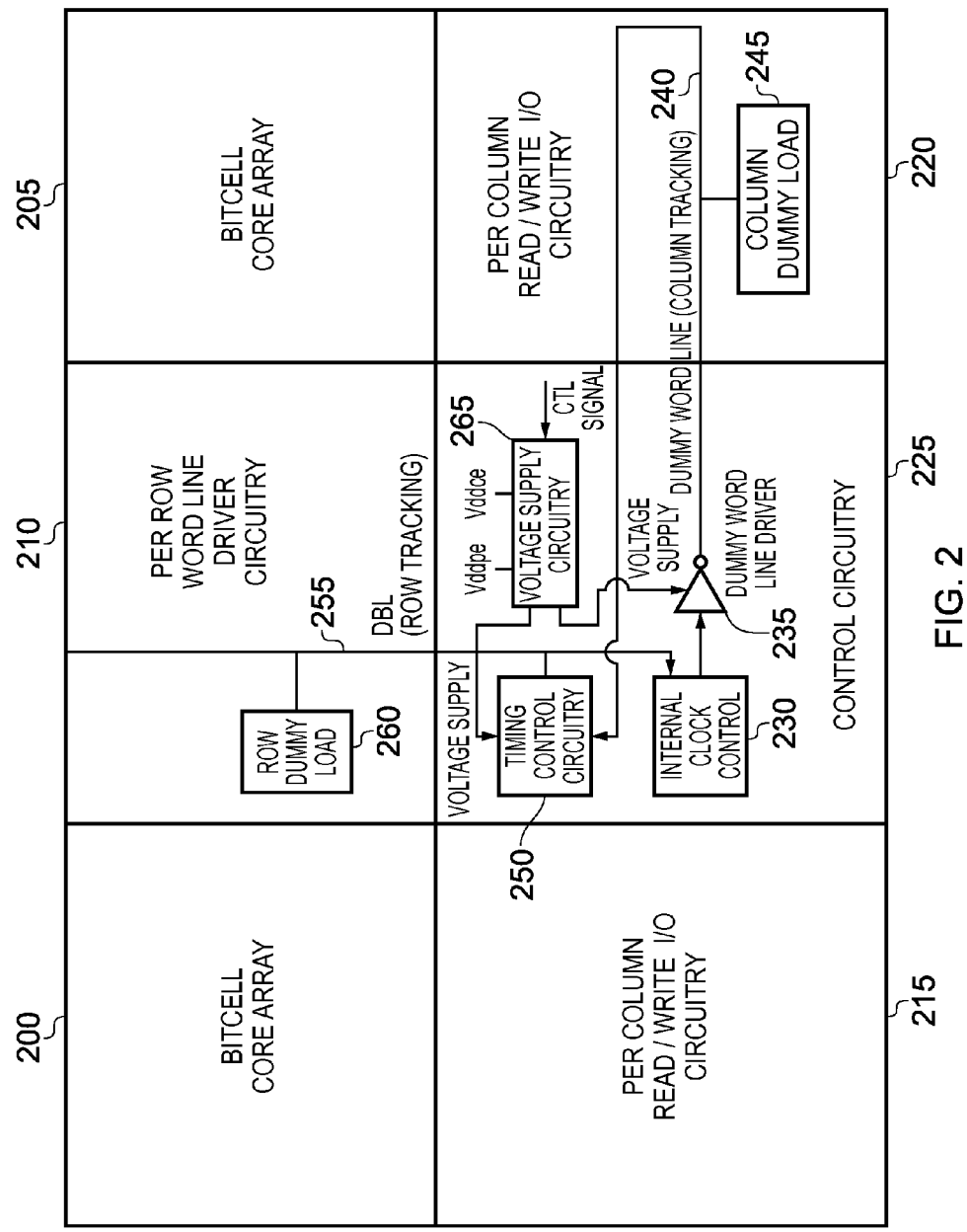
FIG. 2 is a diagram illustrating a memory device in accordance with one embodiment, and in particular providing more detail of the self-timed path delay circuitry provided in accordance with one embodiment.

FIG. 2 is a diagram illustrating schematically the layout of the memory device in accordance with one embodiment, and in particular showing in more detail components provided to form the self-timed path delay circuitry 140. The memory array 105 is in this embodiment formed by two separate bit cell arrays 200, 205, with word line driver circuitry 210 located between the two arrays 200, 205, providing word line driver circuits for each row of memory cells. In one embodiment, each row can be considered as extending through the bit cell array 200 and the bit cell array 205. Each bit cell array 200, 205 has associated read/write input/output circuitry 215, 220 which provides read and write circuits per column of memory cells. The read/write input/output circuits 215, 220 include the sense amplifier circuitry 120, write driver circuitry 125 and precharge circuitry 115 of FIG. 1 (the precharge circuitry often being incorporated within the sense amplifier circuitry and write driver circuitry).

For the purposes of the embodiments described herein, it will be assumed that the memory bit cells are 6T SRAM cells, but the self-timed path delay mechanism of the described embodiments can also be used in association with different memory cell configurations, for example 8T SRAM cells.

Control circuitry 225 is provided for controlling the operation of the word line driver circuitry 210 and the read/write input/output circuits 215, 220 in order to perform read and write access operations in respect of selected bit cells within the arrays 200, 205.

The control circuitry 225 includes STP delay circuitry 140 as discussed earlier with reference to FIG. 1. In one embodiment, the STP delay circuitry 140 is controlled by an internal clock control block 230 within the control circuitry 225. The internal clock control circuitry 230 provides a control signal to a first portion of the STP delay circuitry 140 formed by a dummy word line driver circuit 235. The dummy word line driver circuit 235 controls the voltage on a dummy word line 240 which traverses across the width of the bit cell core array 205 and back, thereby replicating the length of a word line extending through both the bit cell core array 200 and the bit cell core array 205 (in this embodiment both bit cell core arrays 200 and 205 being of the same size). Coupled to the dummy word line 240 is a column dummy load 245 (for example formed by a number of capacitive elements connected to the dummy word line). The column dummy load 245 is arranged so as to be representative of the loading of an actual word line running through the bit cell core arrays 200, 205, and in particular represents the loading due to the number of columns running through the core arrays (and hence the number of memory cells coupled to a word line). In particular, when a particular row within the memory arrays 200, 205 is selected for access, the voltage on the word line coupled to that selected row will be driven from a first voltage level (representing a logic zero value) to a second voltage level (representing a logic one value) by the appropriate word line driver circuit within the circuitry 210. The number of memory cells coupled to that word line will influence how quickly the voltage changes from the first voltage level to the second voltage level, and hence to a level where the memory cells of the selected row are activated for reading or writing. The dummy word line driver 235 can be caused to perform a similar transition of the voltage on the dummy word line, with the column dummy load 245 being configured to present an expected worst case loading scenario on a word line within the actual bit cell core arrays 200, 205.

The dummy word line 240 is connected to timing control circuitry 250, the timing control circuitry 250 also being connected to a dummy bit line 255. The dummy bit line 255 is arranged to extend along the length of the bit cell core array 200, 205, as per the standard bit lines present within each of the bit cell core arrays 200, 205. The dummy bit line 255 is connected to a row dummy load 260 which is configured to be representative of the loading present on a real bit line within the bit cell core arrays 200, 205, due to the number of memory cells coupled to that real bit line (which is dependent on the number of rows intersecting that bit line).

The timing control circuitry 250 is coupled between the dummy word line 240 and the dummy bit line 255 and is configured to control how quickly a transition in voltage level on the dummy word line 240 introduced by the dummy word line driver 235 results in a transition in voltage on the dummy bit line 255. The details of the timing control circuitry 250 in one embodiment will be discussed later with reference to FIG. 4, but in summary the timing control circuitry is intended to introduce a delay corresponding to a delay occurring by operation of an activated memory cell within the bit cell array 200, 205. The dummy bit line 255 is precharged to a precharge voltage level, and then is discharged under control of the timing control circuitry 250, following assertion of a word line voltage by dummy word line driver 235 on the dummy word line 240. When the voltage on the dummy bit line has transitioned to a predetermined level, this is noted by the internal clock control circuitry 230, and then used to control the operation of the read/write input/output circuits. In particular, for a read access, once the dummy bit line has been discharged to a predetermined level, this will cause the control circuitry 225 to issue the read enable signal to the sense amplifier circuitry 120 to cause the sense amplifier circuitry to evaluate the voltages on the bit lines connected to the bit cell core arrays 200, 205. For a write operation, the write enable signal will typically be asserted at the start of the write operation, and when the voltage on the dummy bit line has been discharged to the predetermined level, the control circuitry 225 will then cause the write enable signal to be de-asserted, since at this point it will be concluded that sufficient time has lapsed for the data to have been written into the addressed bit cells within the bit cell core arrays 200, 205.

In accordance with the embodiment illustrated in FIG. 2, voltage supply circuitry 265 is used to select the voltage supply to be provided to one or both of the dummy word line driver 235 and the timing control circuitry 250. In particular, the voltage supply circuitry 265 receives both the core voltage supply Vddce and the peripheral voltage supply Vddpe, and dependent on a received control signal will then select which of those two voltage supplies to provide to the dummy word line driver 235 and the timing control circuitry 250. As will be discussed in more detail later, in one embodiment it is not necessary for the same voltage supply to be provided to both the dummy word line driver 235 and the timing control circuitry 250, and indeed in certain situations the voltage supply provided to those two portions of the STP delay circuitry will be different.

Figure 3:
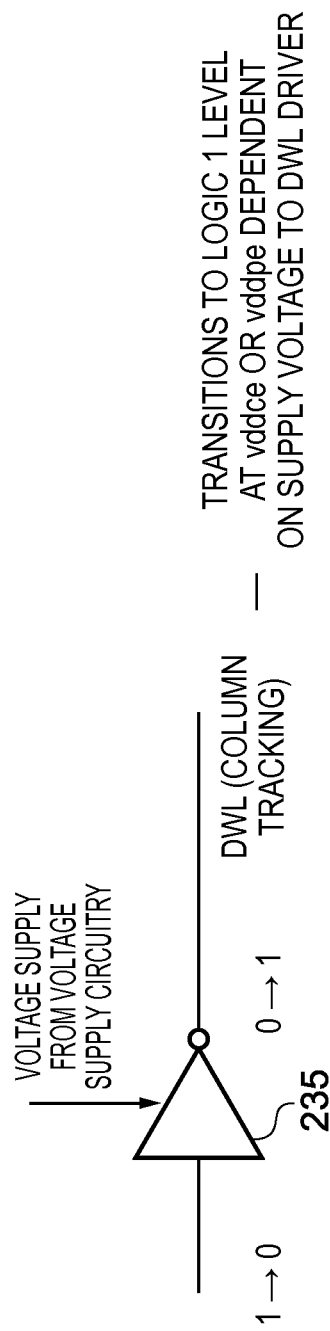
FIG. 3 illustrates the operation of the dummy word line driver of FIG. 2 in accordance with one embodiment.

FIG. 3 schematically illustrates the operation of the dummy word line driver 235. During a precharge stage prior to performance of the read or write operation, the input to the dummy word line driver 235 will be at a logic one value, causing a logic zero value to be output on the dummy word line 240. This in turn will cause the voltage on the dummy bit line to be precharged to a precharge voltage level by the timing control circuitry 250. In one embodiment, the voltage to which the dummy bit line is precharged is dependent on the voltage supply provided to the timing control circuitry 250, and hence if the timing control circuitry 250 is operating from the Vddpe voltage supply, the dummy bit line 255 would be precharged to the Vddpe voltage level, and conversely if the timing control circuitry 250 is operating from the Vddce voltage supply, then the dummy bit line 255 will be precharged to the Vddce voltage level.

The internal clock control circuitry 230 then activates the STP delay circuitry by issuing a logic zero value to the dummy word line driver 235, which causes the voltage on the dummy word line 240 to transition from the logic zero level to the logic one level. The actual voltage associated with the logic one level will be dependent on the voltage supply used to operate the dummy word line driver 235, and hence will be a Vddce voltage level if the Vddce voltage supply is provided to the dummy word line driver 235, or will be the Vddpe voltage level if the Vddpe voltage supply is used to operate the dummy word line driver 235. As discussed earlier, the presence of the column dummy load 245 will result in the transition of the voltage level from the logic zero level to the logic one level occurring over a period of time, and accordingly the input as received by the timing control circuitry 250 from the dummy word line will transition over that period of time from the logic zero to the logic one level.

Figure 4:
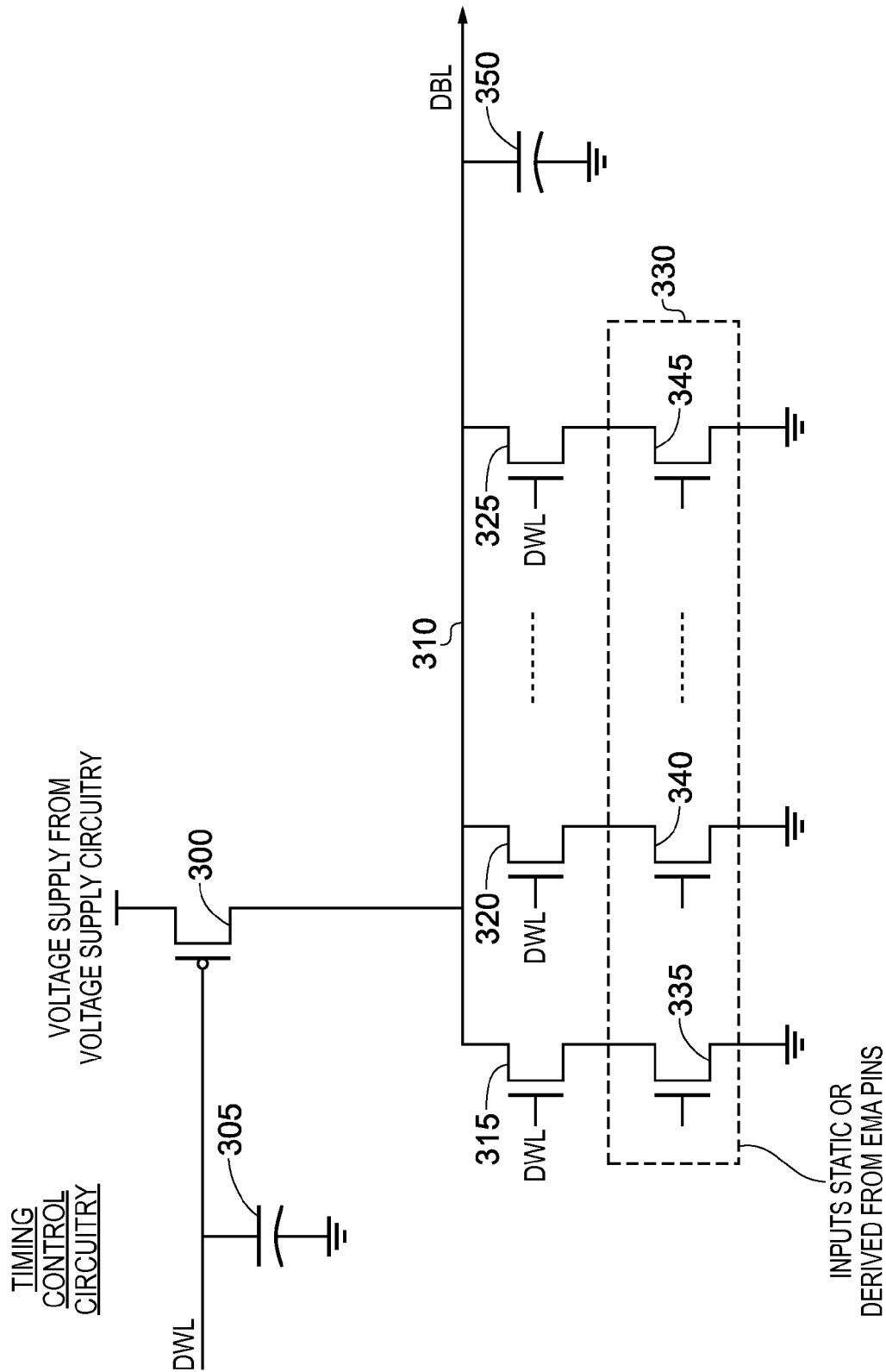
FIG. 4 illustrates in more detail the timing control circuitry of FIG. 2 in accordance with one embodiment.

FIG. 4 illustrates in more detail components provided within the timing control circuitry 250 of FIG. 2 in accordance with one embodiment. PMOS transistor circuitry 300 has its gate connected to the dummy word line. During the precharge phase the voltage on the dummy word line will be at a logic zero level, hence turning on the PMOS transistor circuitry, and causing the dummy bit line 310 to be pulled up to the voltage supply level as supplied by the voltage supply circuitry 265. The element 305 represents some parasitic capacitance present on the input to the PMOS transistor circuitry 300.

Once the STP delay circuitry 140 has been activated, then the voltage on the dummy word line will rise from the logic zero level to the logic one level over time, and as will be seen from FIG. 4 this will cause the PMOS transistor circuitry 300 to be turned off, and the parallel arrangement of NMOS transistors 315, 320, 325 to be turned on. An additional series of transistors 335, 340, 345 forming a control block 330 can be added to allow some configurability as to how many parallel NMOS transistors are used to pull down the voltage on the dummy bit line, and accordingly to control how quickly the dummy bit line will be discharged once the transistors 315, 320, 325 are turned on. One or more of the inputs to the transistors 335, 340, 345 may be predetermined, for example to ensure that at least one route to ground is provided in any configuration, but the inputs to one or more of the other transistors 335, 340, 345 may be configurable to control the strength of the pull down operation.

For example, some designs provide extra margin adjustment (EMA) pins allowing for programmable values to be input which are then used to control how many of the transistors within the control block 330 are turned on, and hence control the strength of the discharge operation performed on the dummy bit line 310. Considering the situation where the peripheral voltage supply is less than the core voltage supply, then dependent on the gap between the two voltage supplies, the delay provided by the STP delay circuitry can be tuned using the EMA pins to tune the strength of the pull-down operation and hence the overall delay introduced by the STP delay circuitry, thereby maintaining a suitable margin for the read and write operations.

The element 350 indicates a parasitic capacitance present on the dummy bit line 310.

Figure 5:
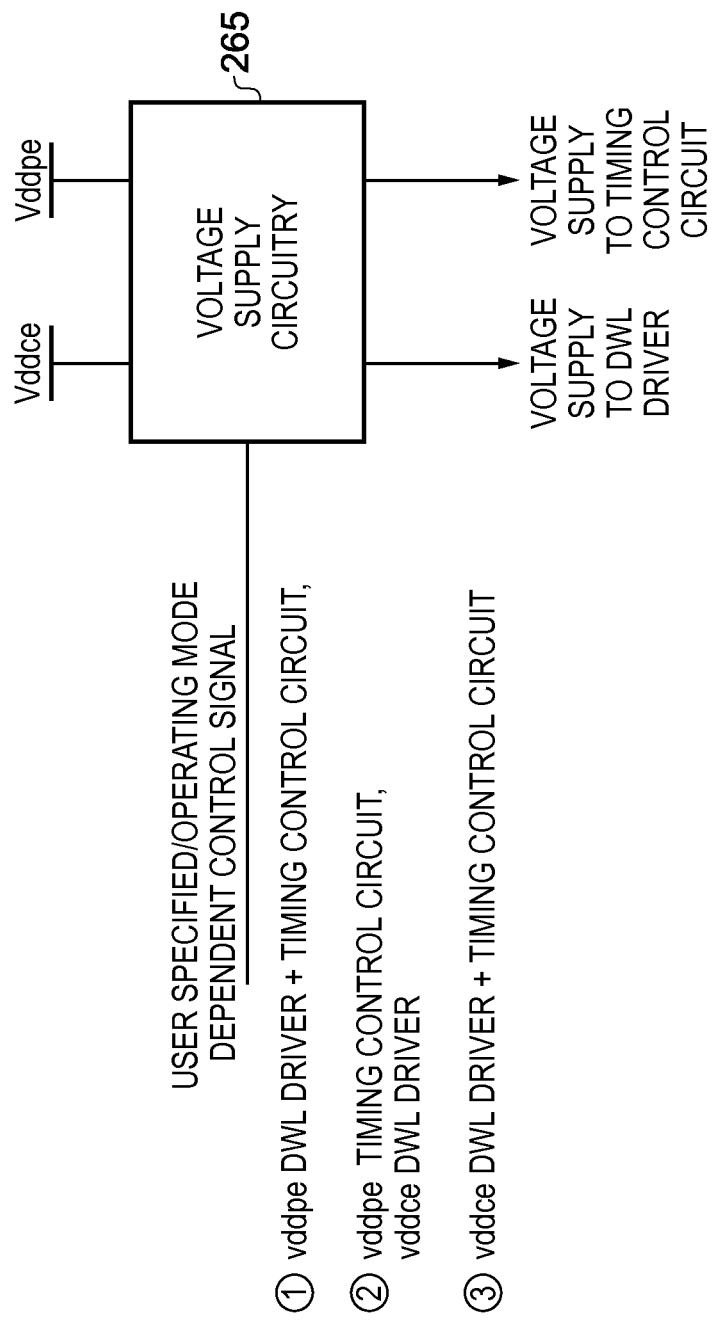
FIG. 5 illustrates the operation of the voltage supply circuitry of FIG. 2 in accordance with one embodiment.

FIG. 5 schematically illustrates how the voltage supply circuitry 265 may be used in one embodiment to determine which voltage supply to provide to each of the dummy word line driver 235 and the timing control circuitry 250. In this embodiment, a user specified or operating mode dependent control signal is used to determine the voltage supply to each of these two portions of the STP delay circuitry. In particular, a first value of the control signal is used to indicate that the Vddpe voltage supply should be provided to both the dummy word line driver 235 and the timing control circuitry 250. A second value of control signal is then used to indicate that the Vddpe voltage supply should be provided to the timing control circuitry 250, but that the Vddce voltage supply should be provided to the dummy word line driver circuitry 235. Finally, a third value of the control signal that is used to indicate that the Vddce voltage supply should be provided to both the dummy word line driver 235 and the timing control circuitry 250.

Whilst the control signal is user specified or operating mode dependent, the value of the control signal will typically be set having regard to the voltage levels of the core voltage supply and the peripheral voltage supply. In a case where the peripheral voltage supply Vddpe is at a lower voltage level than the core voltage supply Vddce by some predetermined amount then the first value will be specified for the control signal and the STP delay circuitry will operate entirely in the peripheral voltage domain. However, if the voltage level of the Vddpe voltage supply is approximately equal to the voltage level of the Vddce voltage supply within some specified range, then the second control value will typically be selected to cause the DWL driver 235 to now receive the Vddce voltage supply. The remainder of the STP delay circuitry 140 will continue to operate in the peripheral voltage domain. It has been found that such an approach enables better row and column tracking in such situations, and hence enables the STP delay circuitry to ensure that a sufficient delay is introduced to ensure that the data read by the sense amplifier circuitry 120 during a read operation correctly represents the data held in the addressed memory cells, and similarly to ensure that during a write operation the correct data is written into the addressed memory cells, and in particular that the memory cells have time to internally store the correct values before the write operation is terminated.

In one embodiment, if the Vddpe voltage supply exceeds the Vddce voltage supply by some predetermined amount, then the voltage supply circuitry 265 receives the third control signal value discussed above, hence causing both the DWL driver 235 and the timing control circuitry 250 to be driven by the Vddce voltage supply. Hence, in this embodiment, both the dummy word line driver 235 and the timing control circuitry 250 effectively operate in the core voltage domain. In situations where the peripheral voltage supply exceeds the core voltage supply, it has been found that such an arrangement provides improved row and column tracking, and ensures correct read and write operation.

In embodiments where the control signal is user specified, the control signal value will typically be specified by the SoC designer when the memory device is integrated into the SoC, based on the Vddpe and Vddce voltage levels to be used in that SoC design. Where the SoC is designed to support several operating modes, having different Vddpe and Vddce voltage levels, then different control values can be specified for each of the operating modes, so that the voltage levels provided to the various STP delay circuit portions can be varied dynamically during use, dependent on the operating mode of the SoC.

Figure 6:
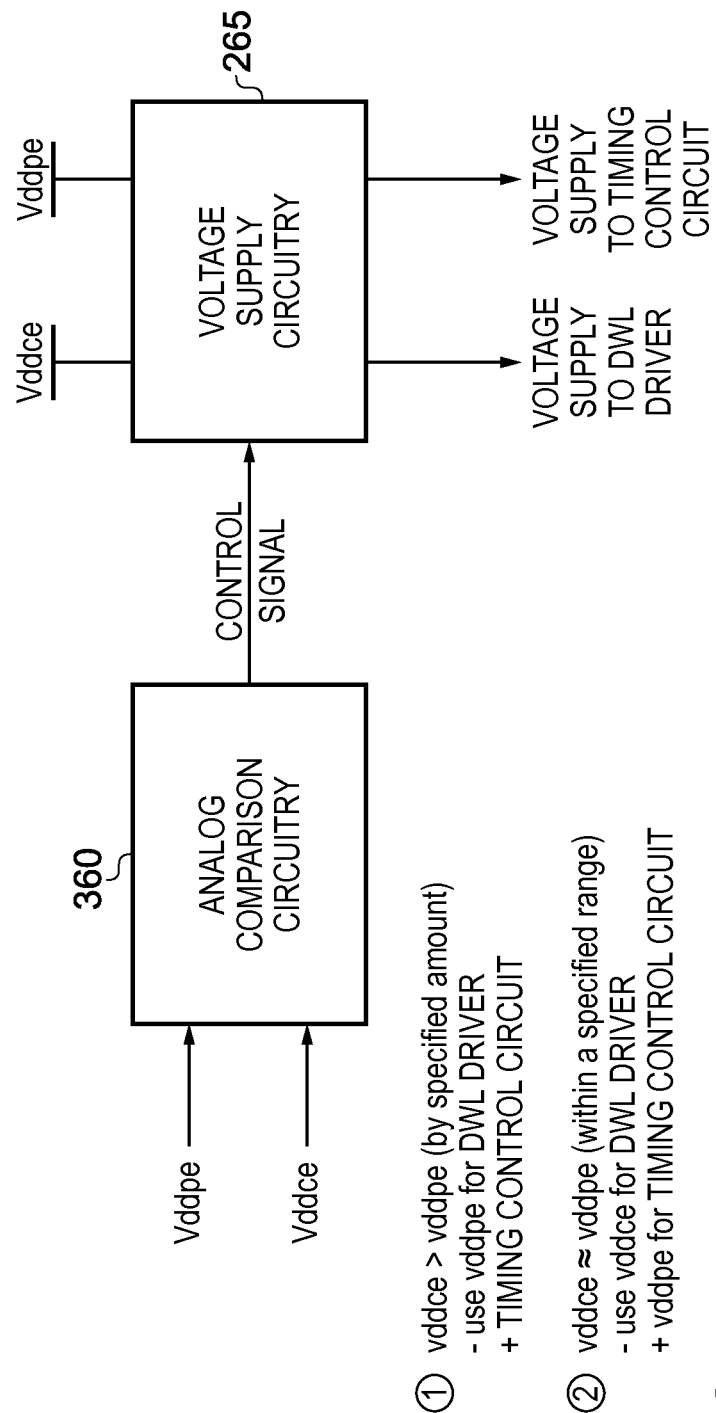
FIG. 6 illustrates the operation of the voltage supply circuitry of FIG. 2 in accordance with an alternative embodiment.

FIG. 6 illustrates an alternative embodiment where analog comparison circuitry 360 is provided within the apparatus to generate the control signal provided to the voltage supply circuitry 265 dependent on a comparison of the relative voltage levels of the Vddpe and Vddce voltage supplies. In the embodiment illustrated in FIG. 6, it is assumed that the analog comparison circuitry 360 generates the control signal at one of the three different values discussed with reference to FIG. 5, based on the results of its comparison of the voltage levels of the Vddpe and Vddce voltage supplies.

Figure 7:
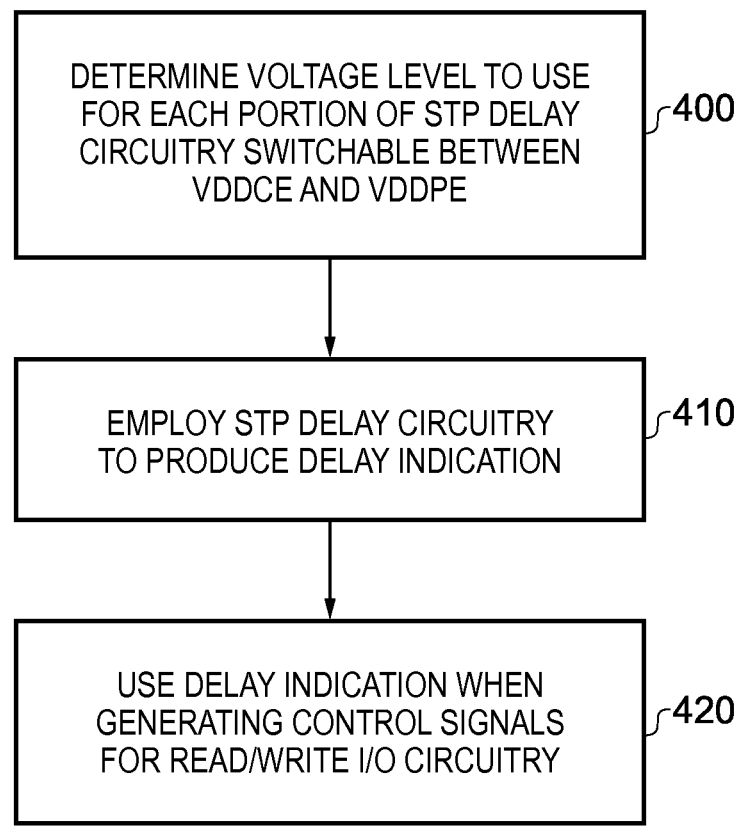
FIG. 7 is a flow diagram illustrating how the self-timed path delay circuitry is used in accordance with one embodiment.

FIG. 7 is a flow diagram illustrating how the STP delay circuitry is used in accordance with one embodiment. At step 400, the voltage level to be used for each portion of the STP delay circuitry that is switchable between the Vddce and the Vddpe voltage supplies is determined. In the embodiment illustrated in FIG. 2, this determination is performed for both the dummy word line driver 235 and the timing control circuitry 250. Thereafter, at step 410, the STP delay circuitry is employed to produce a delay indication indicative of an access timing delay associated with accessing the memory cells. The amount of delay indicated by the delay indication will differ depending on which of the voltage supplies is used for each of the STP delay circuit portions.

At step 420, the delay indication is used by the control circuitry 225 when generating control signals for the read/write input/output circuits 215, 220, thus controlling the sense amplifier timing during a read operation, and the duration of operation of the write driver circuitry 125 during performance of a write operation.

FIGS. 8 and 9 provide two tables illustrating simulation data obtained firstly when the voltage supply to the STP delay circuitry is fixed at the Vddpe level, and secondly where at least the voltage supply to the dummy word line driver 235 is changed to the Vddce level. FIG. 8 is a table showing the read margin measured as a sense amp differential voltage (in mV). The test cases 1 to 4 shown in the upper portion 500 of the table are for the particular combinations of Vddpe and Vddce voltage levels shown in the relevant entries of the table. In each case, the dummy word line driver 235 continues to be operated at the Vddpe voltage level. These entries show that the read margin degrades quite rapidly as the Vddpe voltage level begins to exceed the Vddce voltage level. Conversely, when the four test cases are repeated in the lower half of the table with the dummy word line driver 235 supplied with the Vddce voltage level, then the degradation significantly reduces, and sufficient read margin is maintained.

In one embodiment, the two entries shown by reference numeral 510 are for a situation where Vddce is supplied to the dummy word line driver 235, but the timing control circuitry 250 continues to operate at the Vddpe level. For the last two entries indicated by the reference numeral 520, the timing control circuitry 250 is also operated at the Vddce level.

FIG. 9 is a similar table with the same four test cases, but for a series of write operations. As can be seen by comparing the entries indicated by the reference numeral 600 with the references indicated by the reference numerals 610 and 620, the write margin is maintained much better when the DWL driver 235 is driven by the Vddce voltage supply in situations where the Vddpe voltage supply exceeds the Vddce voltage supply. As with FIG. 8, for the first two test cases shown by the reference numeral 610, only the dummy word line driver 235 is supplied with the Vddce voltage level, but for the last two test cases shown by the reference numeral 620, both the dummy word line driver 235 and the timing control circuitry 250 are driven by the Vddce voltage level. The write margin referred to in the final column of FIG. 9 refers to the ratio between the time taken to flip the bit cell during the write operation, and the write pulse width (i.e. the duration of the asserted write enable signal to the write driver circuitry 125).

Figure 10:
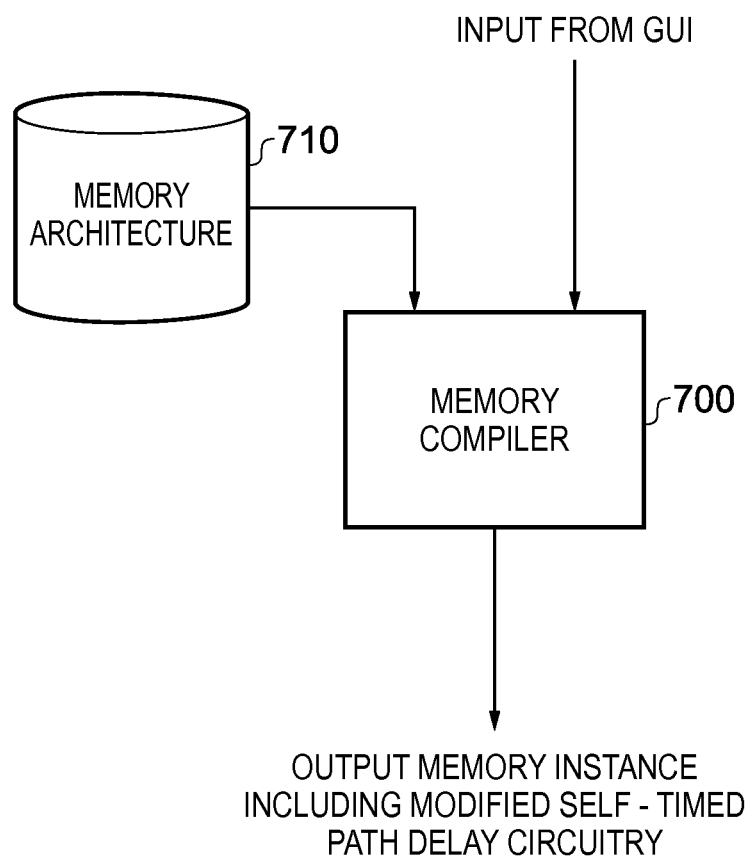
FIG. 10 is a diagram schematically illustrating the operation of a memory compiler to generate a memory instance including self-timed path delay circuitry of the described embodiments.

FIG. 10 schematically illustrates how a memory instance including STP delay circuitry in accordance with the above described embodiments may be created from a memory compiler 700 with reference to a memory architecture 710. The memory architecture 710 specifies a definition of circuit elements and data defining rules for combining those circuit elements in order to create a memory instance. Particular requirements for the memory instance are entered into the memory compiler 700 as input parameters via a graphical user interface (GUI). As will be appreciated by those skilled in the art, such input parameters can specify various aspects of the desired memory instance, for example defining the size of the memory array, the multiplexing arrangements of the memory array, selection of various optional features such as power gating features, built-in-self-test (BIST) modes to be supported, etc.

The memory compiler 700 then generates the required memory instance based on the input parameters and the memory architecture 710. In accordance with one embodiment, the memory compiler includes STP delay circuitry having one or more portions whose voltage supply is switchable between the array voltage supply and the peripheral voltage supply, in the manner described with reference to the earlier figures.

Figure 11:
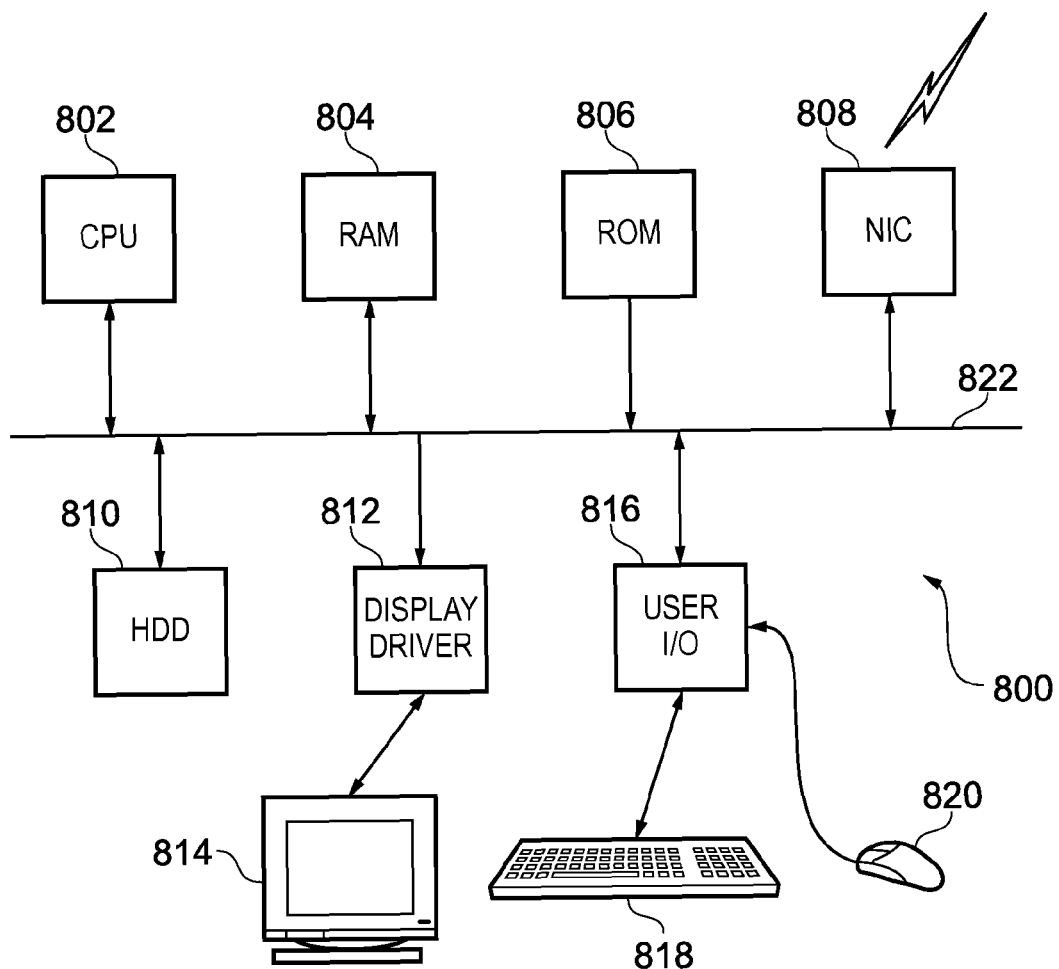
FIG. 11 is a diagram of a computer system on which a memory compiler operation may be performed to generate a memory instance conforming to the above described embodiments.

FIG. 11 schematically illustrates a general purpose computer 800 of the type that may be used to implement the above described memory compilation operation in order to generate a memory instance. The general purpose computer 800 includes a central processing unit 802, a random access memory 804, a read only memory 806, a network interface card 808, a hard disk drive 810, a display driver 812 and monitor 814 and a user input/output circuit 816 with a keyboard 818 and mouse 820 all connected via a common bus 822. In operation the central processing unit 802 will execute computer program instructions that may be stored in one or more of the random access memory 804, the read only memory 806 and the hard disk drive 810 or dynamically downloaded via the network interface card 808. The results of the processing performed may be displayed to a user via the display driver 812 and the monitor 814. User inputs for controlling the operation of the general purpose computer 800 may be received via the user input output circuit 816 from the keyboard 818 or the mouse 820 (and hence for example the input parameters used to determine certain properties of the required memory instance can be entered via this mechanism). It will be appreciated that the computer program could be written in a variety of different computer languages. The computer program may be stored and distributed on a recording medium or dynamically downloaded to the general purpose computer 800. When operating under control of an appropriate computer program, the general purpose computer 800 can perform the above described memory compiler operation and can be considered to form an apparatus for performing the above described memory compiler operation. The architecture of the general purpose computer 800 could vary considerably and FIG. 11 is only one example.

From the above description of embodiments, it will be seen that these embodiments provide an improved STP delay circuit which provides sufficient read and write margins not only when the peripheral voltage supply is less than the core voltage supply, but also in situations where the two voltage supplies are similar, or even in situations where the peripheral voltage supply exceeds the core voltage supply. The voltage supply to different portions of the STP delay circuitry is configurable such that the voltage supply can be varied dependent on the relative voltage levels of the core voltage supply and the peripheral voltage supply. Hence, Power Management IC (PMIC) variation on chip can readily be accommodated whilst maintaining proper read and write margins.

Although particular embodiments have been described herein, it will be appreciated that the invention is not limited thereto and that many modifications and additions thereto may be made within the scope of the invention. For example, various combinations of the features of the following dependent claims could be made with the features of the independent claims without departing from the scope of the present invention.

We claim:

1. A memory device comprising:
   an array of memory cells arranged as a plurality of rows and columns, the array operating in an array voltage domain with an array voltage supply;
   a plurality of word lines, each word line being coupled to an associated row of memory cells;
   a plurality of bit lines, each bit line being coupled to an associated column of memory cells;
   access circuitry coupled to the plurality of word lines and the plurality of bit lines in order to perform access operations in respect of selected memory cells within the array, at least a part of the access circuitry operating in a peripheral voltage domain with a peripheral voltage supply;
   control circuitry configure to control operation of the access circuitry, the control circuitry including self-timed path (STP) delay circuitry configured to generate a delay indication indicative of an access timing delay associated with accessing the memory cells, the control circuitry employing said delay indication when controlling the access circuitry to perform said access operations; and
   voltage supply control circuitry associated with at least one portion of the STP delay circuitry and configured to switch the voltage supply to said at least one portion of the STP delay circuitry between said peripheral voltage supply and said array voltage supply dependent on a control signal set having regard to the voltage levels of said array voltage supply and said peripheral voltage supply.

2. A memory device as claimed in claim 1, wherein if said peripheral voltage supply is less than said array voltage supply by a predetermined amount, the voltage supply control circuitry is configured to provide the peripheral voltage supply to said at least one portion of the STP delay circuitry.

3. A memory device as claimed in claim 1, wherein if said peripheral voltage supply is greater than said array voltage supply by a predetermined amount, the voltage supply control circuitry is configured to provide the array voltage supply to said at least one portion of the STP delay circuitry.

4. A memory device as claimed in claim 3, wherein the voltage supply control circuitry is associated with a plurality of portions of the STP delay circuitry, and is configured to provide the array voltage supply to one or more of said plurality of portions of the STP delay circuitry dependent on a degree to which the peripheral voltage supply is greater than said array voltage supply, and to provide the peripheral voltage supply to any remaining of said plurality of portions of the STP delay circuitry.

5. A memory device as claimed in claim 1, wherein the voltage supply control circuitry is associated with a plurality of portions of the STP delay circuitry, and if said peripheral voltage supply is the same as said array voltage supply within a predetermined margin, the voltage supply control circuitry is configured to provide the array voltage supply to a subset of said plurality of portions of the STP delay circuitry, and to provide the peripheral voltage supply to the remaining of said plurality of portions of the STP delay circuitry.

6. A memory device as claimed in claim 1, wherein said control signal provided to the voltage supply control circuitry is user specified.

7. A memory device as claimed in claim 1, wherein the memory device has a plurality of operating modes, the voltage levels of said array voltage supply and said peripheral voltage supply are dependent on a current operating mode of the memory device, and said control signal provided to the voltage supply control circuitry is dependent on said current operating mode.

8. A memory device as claimed in claim 1, further comprising voltage comparison circuitry configured to receive both the array voltage supply and the peripheral voltage supply, and to set the control signal dependent on an evaluation of the voltage levels of the array voltage supply and the peripheral voltage supply.

9. A memory device as claimed in claim 1, wherein:
   said STP delay circuitry comprises a dummy word line coupled to a column dummy load representative of a loading of a word line within said plurality of word lines; and
   said at least one portion of the STP delay circuitry includes dummy word line driver circuitry used to control a voltage level on the dummy word line.

10. A memory device as claimed in claim 9, wherein said STP delay circuitry further comprises:
    a dummy bit line coupled to a row dummy load representative of a loading of a bit line within said plurality of bit lines; and
    timing control circuitry coupled between said dummy word line and said dummy bit line, the timing control circuitry being configured to control how quickly a transition in voltage level on the dummy word line introduced by the dummy word line driver results in a transition in voltage on the dummy bit line;
    the timing control circuitry forming one of said at least one portions of the STP delay circuitry whose voltage supply is controlled by the voltage supply control circuitry.

11. A method of performing access operations within a memory device comprising an array of memory cells arranged as a plurality of rows and columns, the array operating in an array voltage domain with an array voltage supply, a plurality of word lines, each word line being coupled to an associated row of memory cells, a plurality of bit lines, each bit line being coupled to an associated column of memory cells, and access circuitry coupled to the plurality of word lines and the plurality of bit lines in order to perform access operations in respect of selected memory cells within the array, at least a part of the access circuitry operating in a peripheral voltage domain with a peripheral voltage supply, the method comprising:
    employing self-timed path (STP) delay circuitry to generate a delay indication indicative of an access timing delay associated with accessing the memory cells;
    referencing the delay indication when controlling the access circuitry to perform said access operations; and
    switching the voltage supply to at least one portion of the STP delay circuitry between said peripheral voltage supply and said array voltage supply dependent on a control signal set having regard to the voltage levels of said array voltage supply and said peripheral voltage supply.

12. A computer program storage medium storing a memory compiler computer program for controlling a computer to generate an instance of a memory device from a memory architecture associated with the memory compiler computer program, the memory architecture specifying a definition of circuit elements and data defining rules for combining those circuit elements, such that said instance generated specifies a memory device as claimed in claim 1.

13. A memory device comprising:
    an array of memory cell means arranged as a plurality of rows and columns, the array of memory cell means for operating in an array voltage domain with an array voltage supply;

a plurality of word line means, each word line means for coupling to an associated row of memory cell means;

a plurality of bit line means, each bit line means for coupling to an associated column of memory cell means;

access means for coupling to the plurality of word line means and the plurality of bit line means in order to perform access operations in respect of selected memory cell means within the array, at least a part of the access means for operating in a peripheral voltage domain with a peripheral voltage supply;

control means for controlling operation of the access means, the control means including self-timed path (STP) delay means for generating a delay indication indicative of an access timing delay associated with accessing the memory cell means, the control means for employing said delay indication when controlling the access means to perform said access operations; and voltage supply control means associated with at least one portion of the STP delay means and for switching the voltage supply to said at least one portion of the STP delay means between said peripheral voltage supply and said array voltage supply dependent on a control signal set having regard to the voltage levels of said array voltage supply and said peripheral voltage supply.

\* \* \* \* \*